(12) United States Patent
Scheidler

(10) Patent No.: US 9,060,450 B2
(45) Date of Patent: Jun. 16, 2015

(54) COOLING ARRANGEMENT AND METHOD OF OPERATION FOR A FAN CONTROL

(75) Inventor: Gerold Scheidler, Bad Wünnenberg (DE)

(73) Assignee: Fujitsu Technology Solutions Intellectual Property GmbH (DE)

( * ) Notice: Subject to any disclaimer, the term of this patent is extended or adjusted under 35 U.S.C. 154(b) by 658 days.

(21) Appl. No.: 13/287,209

(22) Filed: Nov. 2, 2011

(65) Prior Publication Data

US 2012/0128507 A1    May 24, 2012

(30) Foreign Application Priority Data

Nov. 19, 2010    (DE) .......................... 10 2010 051 962

(51) Int. Cl.
    *H05K 7/20*    (2006.01)

(52) U.S. Cl.
    CPC ........ *H05K 7/20736* (2013.01); *H05K 7/20836* (2013.01); *H05K 7/20745* (2013.01); *H05K 7/20609* (2013.01)

(58) Field of Classification Search
    CPC .......... H05K 7/20836; H05K 7/20736; H05K 7/20745; H05K 7/20727
    USPC ............. 417/32, 44.1, 45; 62/259.2; 361/690, 361/694, 695; 165/244, 247, 281
    See application file for complete search history.

(56) References Cited

U.S. PATENT DOCUMENTS

| | | | |
|---|---|---|---|
| 6,819,563 B1 * | 11/2004 | Chu et al. ...................... 361/696 |
| 7,254,022 B2 * | 8/2007 | Ebermann ...................... 361/696 |
| 7,568,360 B1 * | 8/2009 | Bash et al. ...................... 62/186 |
| 7,707,880 B2 * | 5/2010 | Campbell et al. ............. 73/202.5 |
| 7,963,118 B2 * | 6/2011 | Porter et al. ................. 62/259.2 |
| 8,189,334 B2 * | 5/2012 | Campbell et al. ............. 361/691 |
| 8,250,877 B2 * | 8/2012 | Correa et al. ................ 62/259.2 |
| 8,266,921 B2 * | 9/2012 | Tashiro ........................ 62/259.2 |
| 8,508,940 B2 * | 8/2013 | Scheidler et al. ............. 361/695 |
| 8,544,289 B2 * | 10/2013 | Johnson et al. ................. 62/186 |
| 8,693,198 B2 * | 4/2014 | Eckberg et al. ............... 361/701 |

(Continued)

FOREIGN PATENT DOCUMENTS

| | | |
|---|---|---|
| DE | 696 17 089 T2 | 11/1996 |
| DE | 102 10 417 A1 | 10/2003 |
| DE | 10 2005 005 588 A1 | 8/2008 |
| DE | 20 2010 007 046 U1 | 9/2010 |
| EP | 0 741 269 B1 | 11/2001 |
| JP | 2004-286365 | 10/2004 |
| JP | 2007-250713 | 9/2007 |
| JP | 2009-157681 | 7/2009 |
| JP | 2010-61446 | 3/2010 |
| JP | 2010-72697 | 4/2010 |
| JP | 2010-524074 | 7/2010 |
| WO | 2010/039120 A1 | 4/2010 |

OTHER PUBLICATIONS

The English translation of the Office Action issued on Sep. 17, 2013 by the Japanese Patent Office in corresponding Japanese Application No. 2011-250608.

*Primary Examiner* — Peter J Bertheaud
(74) *Attorney, Agent, or Firm* — DLA Piper LLP (US)

(57) ABSTRACT

A method of operating a fan control of a cooling arrangement having at least one exhaust air unit that withdraws air heated by electrical or electronic parts of a plurality of plug-in components, and having at least one cooling unit that cools air used for cooling purposes including determining a selected temperature difference for the air used for cooling the server rack relative to power consumption of the at least one exhaust air unit and the at least one cooling unit depending on the temperature difference; measuring at least one actual temperature difference between at least two temperatures of the air used for cooling purposes; and adjusting the speed of a fan for the at least one exhaust air unit depending on a deviation between the determined optimized temperature difference and the actual temperature difference measured.

6 Claims, 5 Drawing Sheets

(56) References Cited

U.S. PATENT DOCUMENTS

| | | |
|---|---|---|
| 2005/0207116 A1 | 9/2005 | Yatskov et al. |
| 2008/0068793 A1 | 3/2008 | Ishimine |
| 2008/0098763 A1* | 5/2008 | Yamaoka ..................... 62/259.2 |
| 2009/0126385 A1 | 5/2009 | Trepte |
| 2010/0064714 A1* | 3/2010 | Tashiro ....................... 62/259.2 |

* cited by examiner

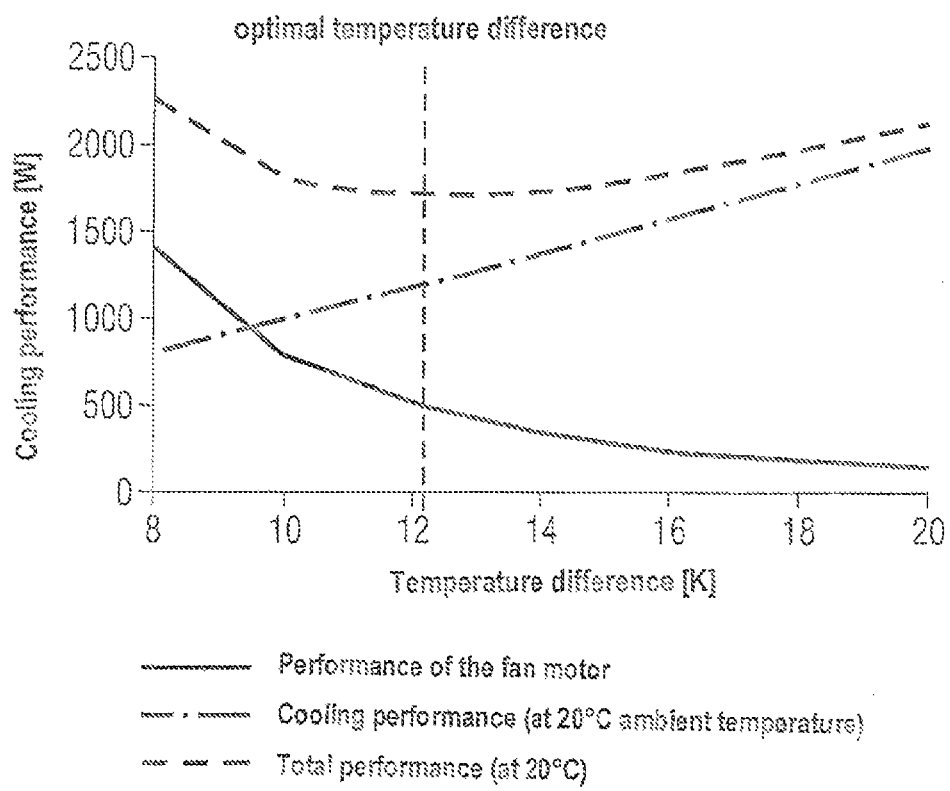

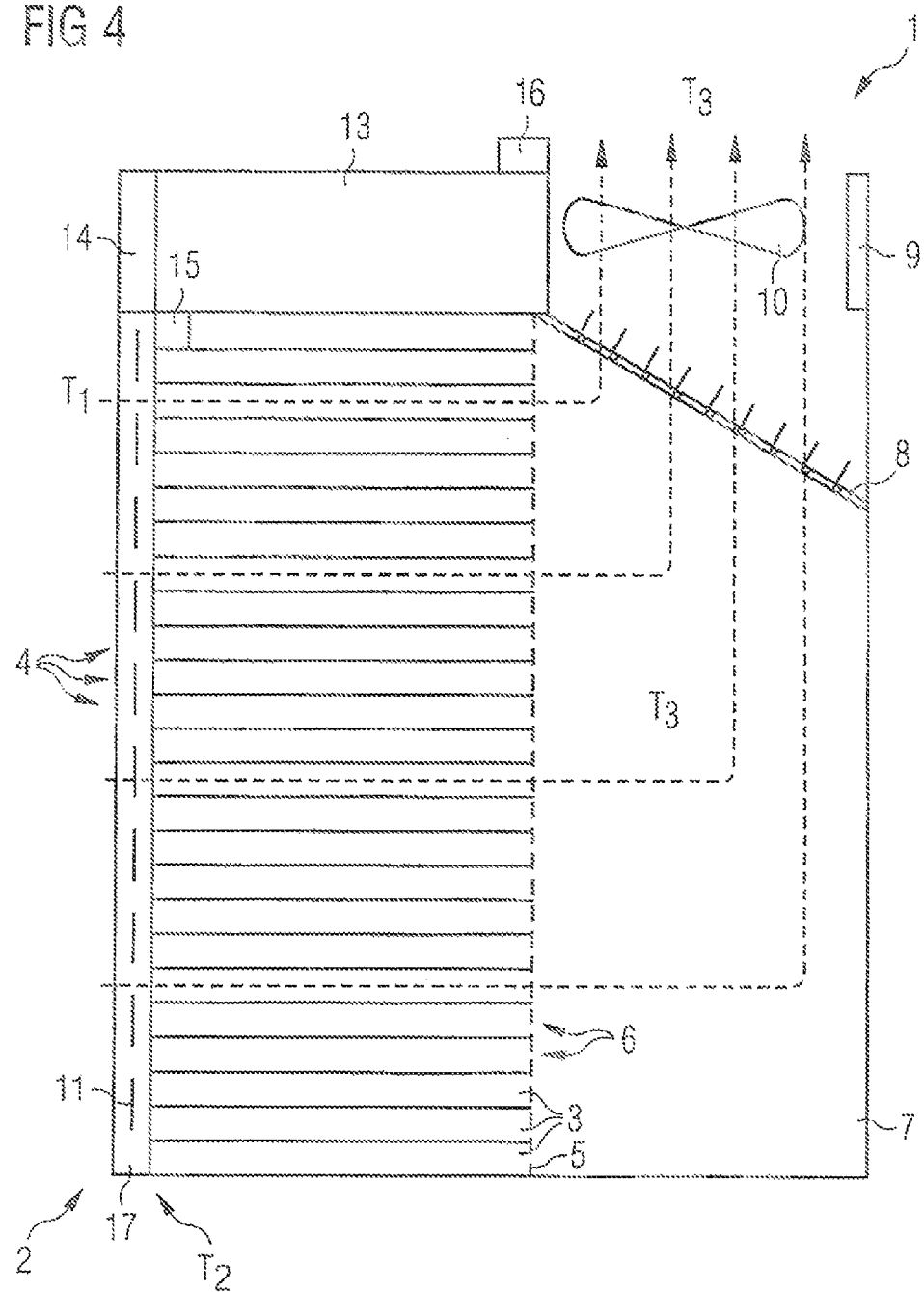

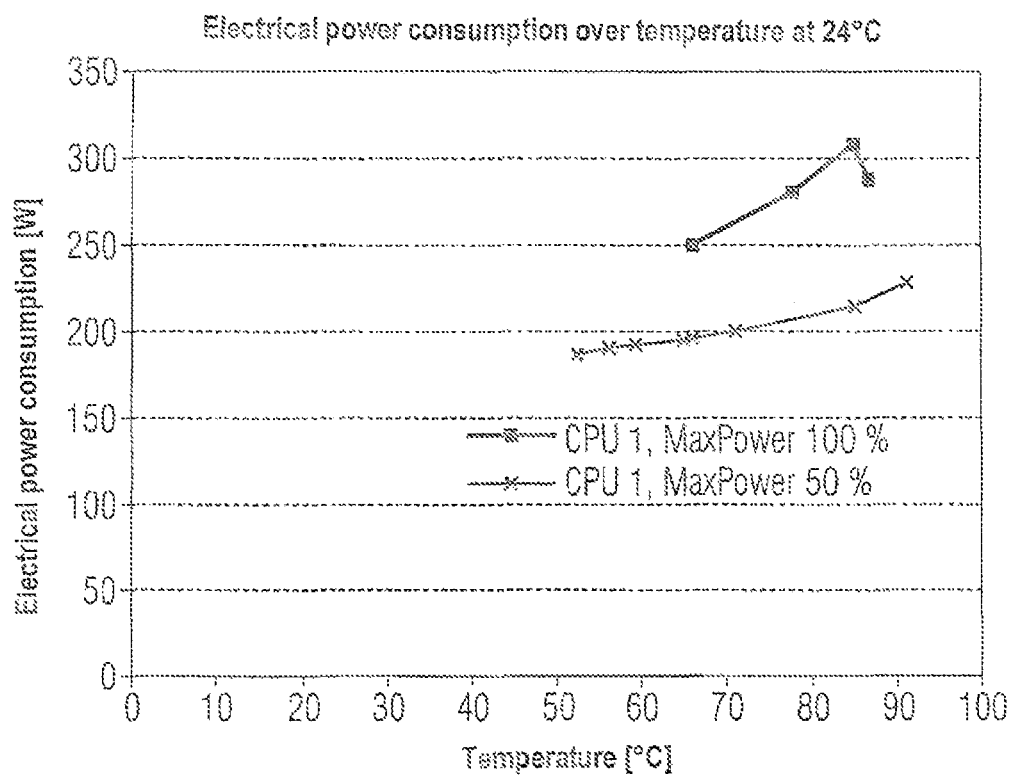

US 9,060,450 B2

COOLING ARRANGEMENT AND METHOD OF OPERATION FOR A FAN CONTROL

RELATED APPLICATIONS

This application claims priority of German Patent Application No. 10 2010 051 962.6, filed Nov. 19, 2010, herein incorporated by reference.

TECHNICAL FIELD

This disclosure relates to a cooling arrangement having a housing with a plurality of plug-in positions for receiving plug-in components. The disclosure further relates to a method of operation for a fan control in a cooling arrangement.

BACKGROUND

Cooling arrangements having a housing with a plurality of plug-in positions for receiving plug-in components are known. For example, DE 202010007046 U1 discloses a rack housing comprising a plurality of plug-in positions for receiving a plurality of fanless plug-in components in a first region of the rack housing adjoining a first housing side. The rack housing has at least one low pressure chamber in a second region of the rack housing adjoining the first region, wherein, between the low pressure chamber and the plug-in positions, first openings are provided which permit discharge of air heated by the plug-in components into the low pressure chamber. The known cooling arrangement also includes an exhaust air unit for producing a negative pressure in the low pressure chamber of the rack housing.

These and similar cooling arrangements are based on the following functional principle. By one or more relatively high-performance fans, ambient air is drawn or blown through the individual plug-in components to effect cooling of the electrical or electronic parts disposed thereon or therein. The heated air is then either discharged directly outwards, for example, via a ventilation device of a building installation or is blown back into a service room, wherein additional cooling of the room must often be ensured by air conditioning systems or similar devices.

In particular in the case of server racks fitted with particularly high-performance plug-in servers, a considerable portion of the power required for their operation is supplied either directly or indirectly to their cooling.

A problem with known cooling arrangements is that the different functional units, in particular plug-in components, housing, exhaust air unit and possibly a cooling unit which is present are provided by different manufacturers and are also optimized independently of each other. For example, the degree of effectiveness of heat exchangers in known arrangements increases with a higher, ambient temperature, which means that their manufacturers advise operation at a relatively high ambient temperature. However, this is disadvantageous for other functional units, in particular semiconductor parts disposed in the plug-in components.

It could therefore be helpful to improve the energy efficiency of cooling arrangements.

SUMMARY

I provide a method of operating a fan control of a cooling arrangement having at least one exhaust air unit that withdraws air heated by electrical or electronic parts of a plurality of plug-in components, and having at least one cooling unit that cools air used for cooling purposes including determining a selected temperature difference for the air used for cooling the server rack relative to power consumption of the at least one exhaust air unit and the at least one cooling unit depending on the temperature difference; measuring at least one actual temperature difference between at least two temperatures of the air used for cooling purposes; and adjusting the speed of a fan for the at least one exhaust air unit depending on a deviation between the determined optimized temperature difference and the actual temperature difference measured.

I also provide a cooling arrangement including a housing with a plurality of plug-in positions for receiving plug-in components, at least one exhaust air unit that withdraws air heated by electrical or electronic parts of the plug-in components, and at least one cooling unit that cools the air used for cooling purposes and is disposed upstream of the plurality of plug-in positions in a flow direction so that the plug-in components disposed in the plug-in positions are ventilated with air which is cooled with respect to a temperature of the provided air.

BRIEF DESCRIPTION OF THE DRAWINGS

FIG. 3 illustrates the cooling performance of a cooling arrangement depending upon a temperature difference.
FIG. 4 illustrates a second possible cooling arrangement.
FIG. 5 illustrates the power consumption of a server insert depending upon a working temperature.

REFERENCE LIST

Figure 1:
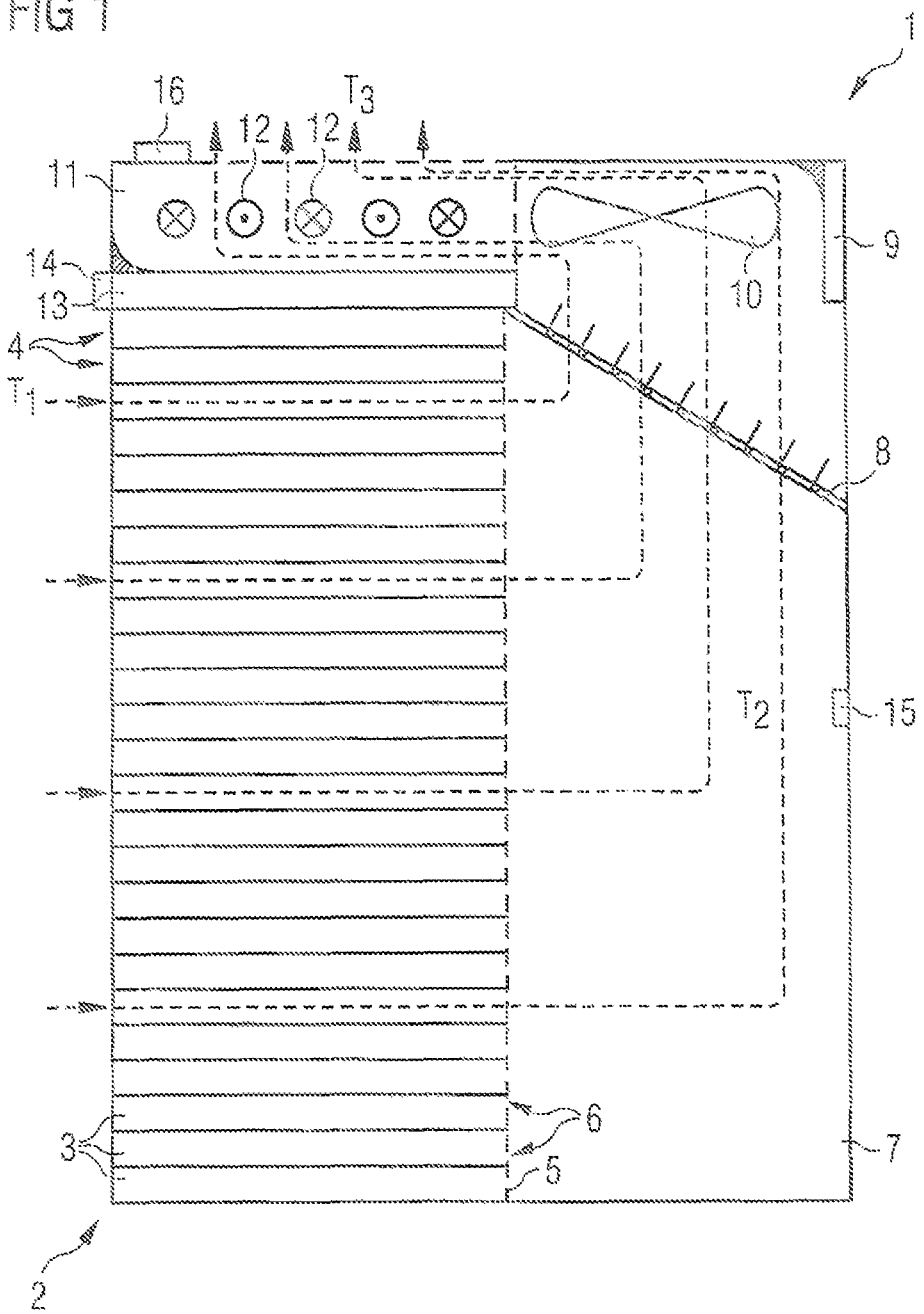
FIG. 1 illustrates a first possible cooling arrangement.

1 Rack housing
2 Front side
3 Plug-in component
4 Plug-in position
5 Bulkhead wall
6 Opening
7 Low pressure chamber
8 Non-return grille
9 Exhaust air unit
10 Fan
11 Cooling unit
12 Heat exchanger
13 Control device
14 First temperature sensor
15 Second temperature sensor
16 Third temperature sensor
17 Housing door

DETAILED DESCRIPTION

It will be appreciated that the following description is intended to refer to specific examples of structure selected for illustration in the drawings and is not intended to define or limit the disclosure, other than in the appended claims.

I provide a method of operation for a fan control of a cooling arrangement having at least one exhaust air unit for withdrawing air heated by electrical or electronic parts of a plurality of plug-in components, and having at least one cooling unit for cooling the air used for cooling purposes. The method of operation includes the following steps:

determining an optimized first temperature difference for the air used for cooling the server rack under consideration of the power consumption of the at least one exhaust air unit and the at least one cooling unit in dependence on the temperature difference and measuring at least one actual temperature difference between at least two temperatures of the air used for cooling purposes; and adjusting the speed of a fan for the at least one exhaust air unit depending upon a deviation between the determined optimised temperature difference and the actual temperature difference measured.

By the steps mentioned above, for the purpose of fan control, at least the power consumption of an exhaust air unit and of a cooling unit can be jointly taken into consideration in dependence upon a temperature difference in the cooling medium used. Consequently, by controlling the fan unit, an air flow through the plurality of plug-in components can be produced to cool them, wherein the combination of the exhaust air unit and the cooling unit as a whole has the lowest possible energy requirement or greatest possible degree of effectiveness.

In the measuring step, at least one temperature of the air used for cooling purposes may be measured before and after flowing through the electrical or electronic parts. By measuring the temperature difference in the air heated by the parts, a closed feedback loop for the fan control can be created.

Further, in the measuring step at least a second temperature difference in the air used for cooling purposes may be measured before and after flowing through the cooling unit. By considering a temperature difference in the air cooled by the exhaust air unit it is possible, among other things, to consider the effect of the fan control on the site where the server rack is set up. For example, it can be ensured that the server rack is temperature-neutral with respect to its surroundings, i.e. the air used for cooling purposes is discharged at the same temperature as it was previously received.

I also provide a cooling arrangement having a housing with a plurality of plug-in positions for receiving plug-in components, at least one exhaust air unit for withdrawing air heated by electrical or electronic parts of the plug-in components, and at least one cooling unit for cooling the air used for cooling purposes. The cooling arrangement is characterized in that the cooling unit is disposed upstream of the plurality of plug-in positions in the flow direction, so that plug-in components disposed in the plug-in positions are ventilated with air which is cooled with respect to a temperature of the provided air.

The arrangement of a cooling unit in the flow direction upstream of a plurality of plug-in positions has the advantage that a lower power loss occurs during operation of the electrical or electronic parts of the plug-in components. This can be attributed, among other things, to the fact that in particular semiconductor components, as used in large numbers in computer arrangements, have leakage current losses which increase as the temperature increases. If the air used for cooling purposes is first cooled, then used for cooling the plug-in components and subsequently discharged, the power loss of the plug-in components used falls while the energy used to cool the air is essentially retained.

Advantageously, the cooling arrangement may form an open cooling system in which air is drawn in from around the housing in the region of the cooling unit and discharged to the environment through the exhaust air unit. A cooling arrangement of this type requires no separate ventilation, system where it is set up.

Advantageously, the at least one cooling unit may have a heat exchanger, wherein the heat exchanger transfers heat energy withdrawn from the cooling unit to a liquid cooling medium. Use of a heat exchanger permits particularly efficient discharge of the heat energy out of the cooling arrangement and, for example, feeding into a heating system of a building installation in a manner which is favorable in terms of energy.

Further advantageously, the housing may be formed as a rack housing for a server rack with the plurality of plug-in positions to receive a plurality of plug-in servers. The rack housing has a cooling air supply which is central for all plug-in positions and which connects the at least one respective opening for extraction of the heated air out of the plug-in positions to the at least one exhaust air unit. Use of a central cooling air supply can simplify the construction and control of the cooling arrangement and in particular the exhaust air unit.

The central cooling air supply may have a low pressure chamber, wherein the at least one exhaust air unit is arranged to produce a negative pressure in the low pressure chamber, which is lower than an ambient air pressure. An arrangement of this type permits safe cooling of fanless plug-in components.

The cooling unit may be disposed on, or instead of, a housing door disposed upstream of the plurality of plug-in positions. The arrangement of the cooling unit on, or instead of, a housing door permits simple modular construction of the housing rack, wherein the cooling unit is disposed in the physical proximity and in the flow direction directly upstream of the plug-in components to be cooled.

The cooling arrangement may be characterized by at least two temperature sensors for detecting a first temperature difference in the air used for cooling and a control device for controlling a fan speed of the exhaust air unit. The control device is arranged to control the exhaust air unit depending upon a power consumption level of the exhaust air unit and a power consumption level of the cooling unit under consideration of the first temperature difference. A cooling arrangement of this type permits construction of a closed feedback loop for the cooling arrangement, wherein the power consumption and effects of the individual cooling components can be tailored to each other.

My cooling arrangements and methods are described in more detail hereinunder with the aid of various examples with reference to the appended figures.

FIG. 1 shows a first example of a cooling arrangement for a server rack.

The cooling arrangement has a rack housing 1 for receiving a plurality of plug-in components 3. The plug-in components 3 are disposed one above the other in plug-in positions 4 of the rack housing 1. The plug-in positions 4 are accessible from a front side 2 of the rack housing 1. The plug-in components 3 are, for example, server plug-ins which have a main board with processors and memory modules disposed thereon. The individual plug-in components have no active cooling components. In particular, the plug-in components 3 have no dedicated fans for drawing in cooling air.

To permit central cooling of all plug-in components 3 in the rack housing 1, the rack housing also has a bulkhead wall 5 with openings 6 between the individual plug-in positions 4 and a low pressure chamber 7 also disposed in the rack housing 1. To cool electrical and electronic parts of the plug-in components 3, ambient air at a temperature $T_1$ is drawn into the low pressure chamber 7 through the plug-in positions 4 and the openings 6 in the bulkhead wall 5. The size of the openings 6 ensures simple adjustment of the cooling air flow required. For example, individual openings 6 can be closed when no plug-in components 3 are disposed in the associated plug-in positions 4.

The heated cooling air is extracted from the low pressure chamber 7 through a non-return grille 8 of a exhaust air unit 9. The exhaust air unit 9 has two fans 10 disposed one behind the other in the cross-sectional view of FIG. 1, wherein each fan is allocated a dedicated non-return grille 8 to close an extraction opening if one of the fans 10 fails. The fans 10 are radial fans which blow the upwardly drawn cooling air forwards into a cooling unit 11 with a heat exchanger 12 disposed therein. The heat exchanger 12 is, for example, a cooling coil which has a liquid cooling medium flowing through it.

The heat exchanger 12 transfers the energy of the heated air at a temperature T2 to the liquid cooling medium so that the air exits after passing through the cooling unit 11 on the upper side of the rack housing 1 at, a temperature $T_3$. The temperature $T_3$ preferably corresponds to the temperature $T_1$ of the ambient air drawn in.

The speed of the fan 10 and possibly regulation of the temperature and/or of the flow rate of the cooling medium in the cooling unit 11 are preset by a central control device 13. To ensure sufficient cooling, the control device 13 is connected to a first temperature sensor 14 and a second temperature sensor 15. The first temperature sensor is disposed in the region of the front side 2 of the rack housing 1 and essentially determines the temperature $T_1$ of the ambient air drawn in. The second sensor 15 is disposed in the low pressure chamber 7 and essentially determines the temperature $T_2$ of the heated cooling air. The control device 13 can further be connected to an optional third temperature sensor 16 in the region of the air outlet of the cooling unit 11. Furthermore, the control device 13 can also detect further input parameters, such as for example the absolute or relative negative pressure in the low pressure chamber 7, and the power consumption or temperature of individual plug-in components 3, and can take account thereof in controlling the fan 10.

The control device 13 is arranged to adjust the fan speed of the fan 10 such that the power consumption of the exhaust air unit 9 and the cooling unit 11 in combination is as low as possible. Of course, sufficient cooling must be ensured for the individual plug-in components 3.

Figure 2:
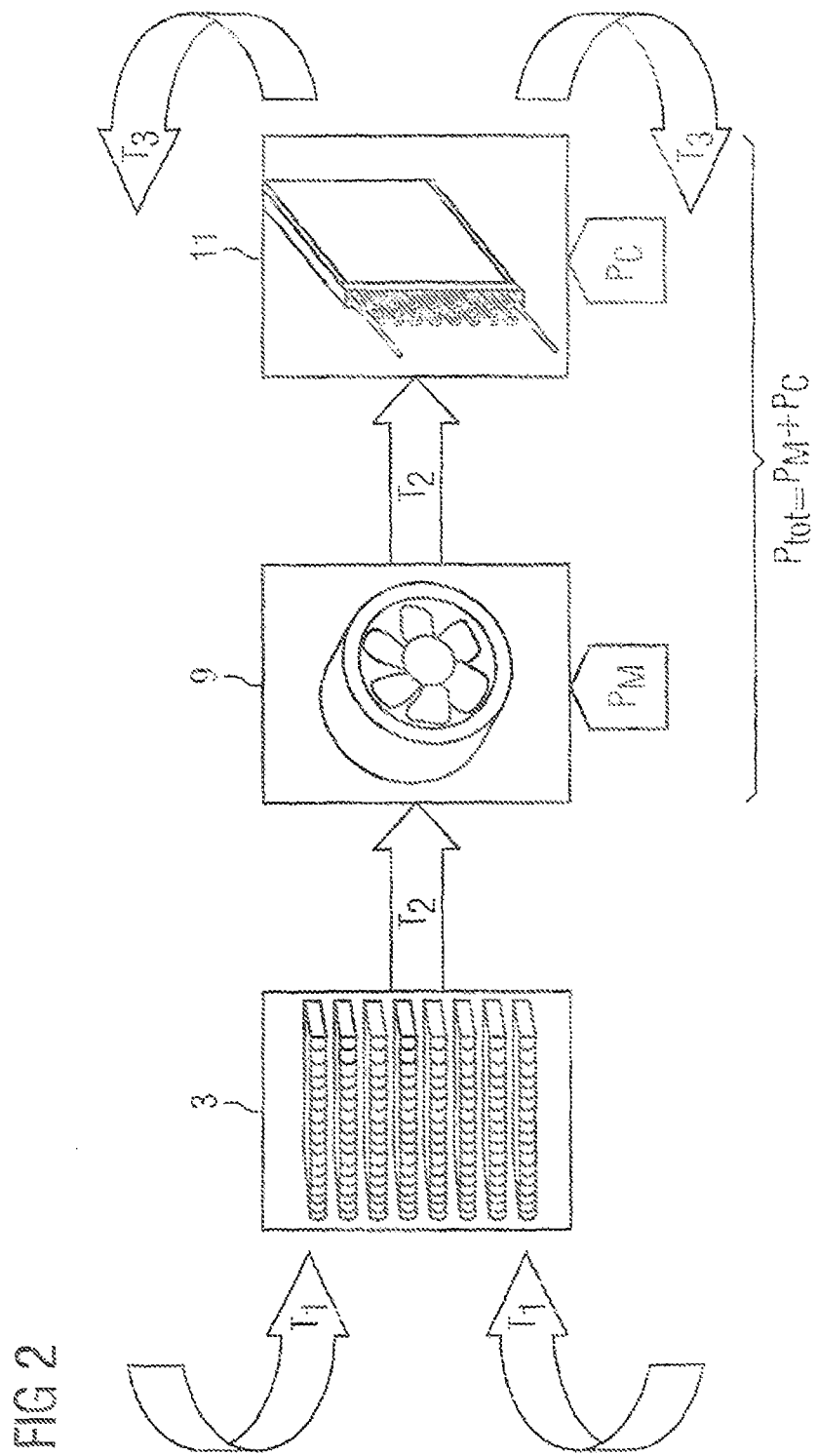
FIG. 2 illustrates a cooling model for determining the power consumption of a cooling arrangement.

FIG. 2 shows a model used for optimizing the power consumption of the described cooling arrangement. As shown in FIG. 2, ambient air at a first temperature $T_1$ is drawn through a plurality of plug-in components 3, for example, server plug-ins for a rack arrangement. The drawn-in ambient air serves to cool electrical or electronic parts which are disposed, for example, on a board of the plug-in component 3. Cooling the electrical or electronic parts simultaneously leads to heating of the ambient air drawn in, which is at a temperature $T_2$ after flowing through the plug-in components according to the model shown in FIG. 2.

In FIG. 2, the heated air is drawn in through an exhaust air unit 9 which, for example, has a fan 10 or similar conveying device. To draw in the air used for cooling, the exhaust air unit 9 has an electrical power level $P_M$ for operation of the fan 10.

To cool the cooling air ejected from the exhaust air unit at the temperature $T_2$ to the level of the ambient air, a cooling unit 11 is shown in FIG. 2. The cooling unit 11 selects a further power level $P_C$ for cooling the heated ambient air. After flowing through the cooling unit, the air used for cooling purposes is at a temperature $T_3$ which is lower than the second temperature $T_2$ and which, in the case of an environmentally neutral cooling arrangement, corresponds to the first temperature $T_1$.

According to the model shown in FIG. 2, the total power consumption for cooling the server rack $P_{tot}$ amounts to the sum of the individual power levels $P_M$ and $P_C$.

The energy efficiency of the individual components, in this case in particular the exhaust air unit 9 and the cooling unit 11, is determined by different factors.

In the case of the exhaust air unit 9, the energy efficiency is determined by the efficiency of a fan motor, the housing geometry of the rack housing 1 and by a volume flow V of the cooling air. The power consumption of the exhaust air unit 9 amounts to, for example, $P_M = k_1 \times V^m$, wherein $k_1$ represents a housing-specific constant and m represents a constant for the efficiency of the fan motor used.

The volume flow V required for cooling the plug-in components 3 is inversely proportional to the temperature difference between the heated air at the temperature $T_2$ and the ambient air at the temperature $T_1$. $V = k_2 \div (T_2 - T_1)$ applies. The constant $k_2$ again represents a constant typical for the housing geometry of the rack housing 1 used.

With the values $k_1 = 28,000$, $K_2 = 10^{-6}$ and $m = 2.5$ the power consumption of the exhaust air unit 9, illustrated with a solid line in FIG. 3, is achieved in dependence upon the temperature difference $\Delta T = T_2 - T_1$. FIG. 3 shows that the power consumption $P_M$ increases strongly with a lower temperature difference $\Delta T$. Conversely, the power consumption $P_M$ of the exhaust air unit drops as the temperature difference $\Delta T$ increases.

The power $P_C$ consumed by the cooling unit 11 is highly dependent on the cooling technology used in each case. If the ambient air and natural heat dissipation are sufficient for cooling the plug-in components 3, the cooling unit 11 consumes no power at all. In the cases of rack arrangements which are of relevance in this instance and which have a plurality of plug-in components 3, however, an active cooling unit 11 is generally used, the power consumption of which can be represented as follows: $P_C = Q \times (T_2 - T_1) \div (T_1 \times E)$. Q corresponds to the thermal energy which is discharged by the cooling unit 11. The value E corresponds to the relative energy efficiency of the cooling technology used. In a heat exchanger 12 the value for E corresponds, for example, to 0.5.

As measurements have shown, the dependency on the absolute ambient temperature $T_1$ for values occurring in practice of, for example, 15 to 25° C. is insignificant with respect to the other factors influencing the power consumption $P_C$. FIG. 3 only shows the power consumption in the case of an air inlet temperature of 20° C. However, the temperature difference $\Delta T = T_2 - T_1$ also has an essential role in the power consumption of the cooling unit 11 as a whole in this case. According to the broken line in FIG. 3, the power consumption $P_C$ of the cooling unit 11 increases in an essentially linear manner as the temperature difference $\Delta T$ increases.

In FIG. 3 the combined power consumption $P_{tot}$ of the exhaust air unit 9 and of the cooling unit 11 is illustrated with a broken line. As shown in FIG. 3, the curve in the middle region has a minimum which corresponds to the lowest total power consumption $P_{tot}$. For greater temperature differences $\Delta T = T_2 - T_1$ the power consumption increases owing to the increasing energy requirement of the cooling unit 11. For lower temperature differences $\Delta T$ the power consumption increases owing to the strongly increasing power consumption of the exhaust air unit 9.

In the previously described example with the constants stated above a minimum is achieved for a temperature difference $\Delta T$ of 12° C. between a temperature $T_1$ of the ambient air and a temperature $T_2$ after heating of the ambient air by the components to be cooled.

The control device 13 preferably determines the temperatures T1, T2 and T3 and adjusts the fan motor in such a way that the air output from the cooling arrangement is not warmer than the drawn-in ambient air or is not warmer than it by more than a preset boundary value, and at the same time the determined optimal temperature difference ΔT is maintained.

To improve the efficiency of the described rack arrangement still further, according to a second example shown in FIG. 4, the cooling unit 11 has been displaced in the flow direction upstream of the plug-in components 3 to be cooled. For example, the cooling unit 11 can be formed as a part of a housing door 17. Owing to the relatively large surface of the housing door 17, the cooling unit 11 can be formed very thin so that only a relatively small amount of space is also required. In this case the air can be output from the low pressure chamber 7 in the upwards direction through the fan 10 in an unhindered manner.

As a result, the ambient air used for cooling purposes is now initially cooled with respect to the temperature $T_1$ of the ambient air to the temperature $T_2$ and then heated through the plug-in components 3 to the temperature $T_3$, for example, again to the temperature $T_1$ of the ambient air.

The advantage of such a cooling arrangement is shown in particular in FIG. 5. In FIG. 5 the electrical power consumption of a server insert 3, which is disposed within a plug-in position 4, is shown over its working temperature. The working temperature of the processor is detected, for example, via a temperature sensor inside a chip. The core temperature of the processor increases depending upon the load thereon. Furthermore, the electrical power consumption increases as the chip temperature increases because the leakage currents occurring in the semiconductor component increase.

When the processor is loaded with a working load of 50 percent, the electrical power consumption of a server insert increases, for example, from about 190 to about 230 watts with a chip temperature of 50 to 90° C. The chip temperature is substantially dependent on the volume flow V of the air used for cooling, which is at a temperature of 24° C. in the exemplified embodiment. If the air flow is lower, the temperature of the chips of the server insert increases further and its power consumption increases. If the air flow is increased, the temperature of the processors falls and their power consumption decreases.

The effect with a fully loaded processor is even more remarkable as shown in the upper part of FIG. 5. When the processor is under full load and with a simultaneous, relatively low volume flow V of cooling air, the server insert finally reaches a power consumption level of more than 300 watts, at which an internal protective mechanism of the processor restricts its working cycle. Consequently, the power consumption of the server insert falls slightly, wherein, however, this is at the same time accompanied by a loss in computing power. In spite of falling absolute power consumption, the energy efficiency of the arrangement as a whole is reduced.

As shown in FIG. 5, the power consumption of processors and other semiconductor chips is lower when the temperature of the chips can be reduced. To this end, in the example according to FIG. 4, the ambient air is first cooled before it is used for cooling the plug-in components 3.

If, for example, a cooling unit 11 is used in the cooling arrangement in accordance with FIG. 1 and reduces the temperature of the air flowing through it by 11° C., the individual parts of the plug-in components 3 have cooling air at the first temperature $T_1$ flowing against them. For example, the temperature $T_1$ is an ambient temperature of 25° C. The components heat the ambient air to a temperature $T_2$ of, for example, 36° C. and it is then cooled by the cooling unit 11 to the ambient temperature of 25° C. Depending on the arrangement of the individual parts in the plug-in components 3 these are surrounded with cooling air at a temperature between 25 and 36° C.

However, according to the cooling arrangement in FIG. 4, the ambient air used for cooling purposes is first cooled to 11° C. so that it enters the individual, plug-in components 3 at a temperature of about 14° C. As the air used for cooling purposes leaves the plug-in components 3 and enters the low pressure chamber 7 it is again at a temperature of 25° C. which corresponds, for example, to the temperature of the ambient air. In this case the individual construction elements of the plug-in components 3 are surrounded by a temperature of, for example, 14 to 25° C. so that their leakage current losses are lower.

The described considerations and concepts for improving the cooling efficiency of rack arrangements complement each other, wherein, on the one hand, by the advantageous arrangement of the cooling unit 11 in the flow direction upstream of the plug-in components 3 to be cooled, the power loss of the individual parts of the plug-in components 3 is reduced and, on the other hand, by combined consideration of the power consumption of the exhaust air unit 9 and of the cooling unit 11, the power consumption of the cooling system as a whole is reduced.

Although the cooling system has been described with reference to a server rack as examples, the claimed cooling arrangement and the method of operation are also suitable for other computer systems. For example, the described devices and processes are also suitable for powerful individual servers with a plurality of individual components such as, for example, drives, memory modules and processors, or for so-called "blade servers" with a plurality of processor and other plug-ins in a common housing.

Although the apparatus and methods have been described in connection with specific forms thereof, it will be appreciated that a wide variety of equivalents may be substituted for the specified elements described herein without departing from the spirit and scope of this disclosure as described in the appended claims.

The invention claimed is:

1. A cooling arrangement comprising:
  a rack housing with a plurality of plug-in positions for receiving plug-in components,
  at least one exhaust air unit associated with the rack housing that withdraws air heated by electrical or electronic parts of the plug-in components, and
  at least one cooling unit associated with the rack housing that cools the air used for cooling purposes and is disposed upstream of the plurality of plug-in positions in a flow direction so that the plug-in components disposed in the plug-in positions are ventilated with air which is cooled with respect to a temperature of the provided air;
  wherein the rack housing has a central cooling air duct for the plug-in positions and which connects at least one respective opening for extraction of the heated air out of the plug-in positions through the at least one respective opening to the at least one exhaust air unit; and
  wherein the cooling arrangement forms an opening cooling system in which air is drawn in from around the rack housing in a region of the cooling unit and discharged to the environment through the exhaust air unit.

2. The cooling arrangement of claim 1, wherein the at least one cooling unit has a heat exchanger and the heat exchanger transfers heat energy withdrawn from the cooling unit to a liquid cooling medium.

3. The cooling arrangement of claim 1, wherein the central cooling air supply has a low pressure chamber and the at least one exhaust air unit is arranged to produce a negative pressure in the low pressure chamber which is lower than ambient air pressure.

4. The cooling arrangement of claim 1, wherein the cooling unit is disposed on, or instead of, a housing door of the rack housing, disposed upstream of the plurality of plug-in positions.

5. The cooling arrangement of claim 1, wherein
at least two temperature sensors that detect a temperature difference in the air are used for cooling purposes, and
a control device that controls fan speed of the exhaust air unit and is arranged to control the exhaust air unit depending on power consumption level of the exhaust air unit and power consumption of the cooling unit relative to the temperature difference.

6. The cooling arrangement of claim 1, wherein the plug-in components are fanless.

\* \* \* \* \*

UNITED STATES PATENT AND TRADEMARK OFFICE
CERTIFICATE OF CORRECTION

| | |
|---|---|
| PATENT NO. | : 9,060,450 B2 |
| APPLICATION NO. | : 13/287209 |
| DATED | : June 16, 2015 |
| INVENTOR(S) | : Scheidler et al. |

It is certified that error appears in the above-identified patent and that said Letters Patent is hereby corrected as shown below:

In the claims,

<u>In Column 8</u>

At line 58, Claim 1, please change "opening cooling" to -- open cooling --.

Signed and Sealed this
Twenty-ninth Day of December, 2015

Michelle K. Lee
*Director of the United States Patent and Trademark Office*